US009728673B2

(12) United States Patent
Nataf et al.

(10) Patent No.: US 9,728,673 B2
(45) Date of Patent: Aug. 8, 2017

(54) METHOD FOR THE PRODUCTION OF MONOLITHIC WHITE DIODES

(71) Applicant: Centre National de la Recherche Scientifique (CNRS), Paris (FR)

(72) Inventors: Gilles Nataf, Golfe Juan (FR); Philippe De Mierry, Valbonne (FR); Sébastien Chenot, Mougins (FR)

(73) Assignee: Centre National de la Recherche Scientifique (CNRS) (FR)

( * ) Notice: Subject to any disclaimer, the term of this patent is extended or adjusted under 35 U.S.C. 154(b) by 0 days.

(21) Appl. No.: 14/763,067

(22) PCT Filed: Jan. 24, 2014

(86) PCT No.: PCT/EP2014/051366
§ 371 (c)(1),
(2) Date: Jul. 23, 2015

(87) PCT Pub. No.: WO2014/114731
PCT Pub. Date: Jul. 31, 2014

(65) Prior Publication Data
US 2016/0005918 A1      Jan. 7, 2016

(30) Foreign Application Priority Data

Jan. 24, 2013   (FR) ..................... 13 50621

(51) Int. Cl.
*H01L 33/06* (2010.01)
*H01L 21/02* (2006.01)
(Continued)

(52) U.S. Cl.
CPC .......... *H01L 33/06* (2013.01); *H01L 21/0254* (2013.01); *H01L 33/0075* (2013.01);
(Continued)

(58) Field of Classification Search
CPC ...................................................... H01L 33/06
(Continued)

(56) References Cited

U.S. PATENT DOCUMENTS 8,686,397 B2 *   4/2014   Nakamura .......... H01L 33/0062
                                                         257/13
2006/0049415 A1   3/2006   Liao et al.
(Continued)

FOREIGN PATENT DOCUMENTS

DE    10-2010-029916 A1    12/2011

OTHER PUBLICATIONS

French Search Report for Application No. FR1350621 dated Jul. 19, 2013.
(Continued)

*Primary Examiner* — Dung Le
(74) *Attorney, Agent, or Firm* — Lerner, David, Littenberg, Krumholz & Mentlik, LLP

(57) ABSTRACT

The invention relates to a method for the production of a light-emitting diode, characterized in that the method comprises a step of preparing a light-emitting layer (20) on a front face of a support (10), said emitting layer comprising at least two adjacent quantum wells (21, 22, 23) emitting at different wavelengths, said quantum wells (21, 22, 23) being in contact with the front face of the support. According to the invention, the step in which the light-emitting layer is deposited comprises a sub-step consisting in locally varying the temperature of a rear face of the support opposite the front face such that the front face of the support comprises at least two zones at different temperatures.

14 Claims, 10 Drawing Sheets

(51) Int. Cl.
*H01L 33/00* (2010.01)
*H01L 33/08* (2010.01)

(52) U.S. Cl.
CPC .......... *H01L 33/08* (2013.01); *H01L 21/0242* (2013.01); *H01L 21/02389* (2013.01); *H01L 21/02458* (2013.01); *H01L 21/02494* (2013.01)

(58) Field of Classification Search
USPC ..................................................... 257/89, 90
See application file for complete search history.

(56) References Cited

U.S. PATENT DOCUMENTS

| | | | |
|---|---|---|---|
| 2008/0308835 A1* | 12/2008 | Pan ........................ | B82Y 20/00 257/103 |
| 2008/0308906 A1* | 12/2008 | Osada .................... | C30B 25/02 257/615 |
| 2009/0258452 A1* | 10/2009 | Enya ................. | H01L 21/02389 438/46 |
| 2010/0148147 A1 | 6/2010 | Bour et al. | |
| 2011/0248295 A1* | 10/2011 | Stauss ................ | H01L 25/0753 257/89 |

OTHER PUBLICATIONS

International Search Report for Application No. PCT/EP2014/051366 dated Apr. 15, 2014.
Considered International Written Opinion for Application No. PCT/EP2014/051366 dated Apr. 15, 2014.

\* cited by examiner

METHOD FOR THE PRODUCTION OF MONOLITHIC WHITE DIODES

CROSS REFERENCE TO RELATED APPLICATIONS

The present application is a national phase entry under 35 U.S.C. §371 of International Application No. PCT/EP2014/051366, filed Jan. 24, 2014, published in French, which claims priority from French Patent Application No. 1350621, filed Jan. 24, 2013, the disclosures of which are incorporated by reference herein.

FIELD OF THE INVENTION

The invention concerns the technical field of light-emitting diodes and their associated method of production. In particular, the present invention concerns the field of light-emitting diodes emitting white light.

OVERVIEW OF THE PRIOR ART

From the document US 2006/0049415 monolithic light-emitting diodes are known which are suitable for emitting light in the visible spectrum, such as white light or a light of predetermined colour for example.

Such a monolithic light-emitting diode comprises:
A sapphire substrate 1,
A buffer layer 2A, 2B of gallium nitride (known as "GaN" in the following text) on the sapphire substrate 1,
A layer 2C of n-doped gallium nitride (known as "n-GaN" in the following text) on the buffer layer of GaN,
A metal contact 3 on the n-GaN layer 2C,
A stack 4 of quantum wells of indium nitride and gallium InGaN type (known as "InGaN" in the following text) and barrier layers of GaN,
A layer 6 of p-doped gallium nitride (known as "p-GaN" in the following text) on the GaN/InGaN stack,
A metal contact 7 on the p-GaN layer 6.

The stack of quantum wells is composed of an alternate superposition of quantum wells emitting in the blue region (4B, 4K, 4M) or in the green region (4D, 4F, 4H) and barrier layers of GaN (4A, 4C, 4E, 4G, 4J, 4L, 4N). This stack of quantum wells emitting in different colours makes it possible to obtain white light.

However, the quality of the white obtained (or "CRI", an acronym of Color Rendering Index) is mediocre, due to the fact that the internal quantum efficiency of quantum wells emitting in the green region is less than that of quantum wells emitting in the blue region. The result is a "whitish" colour tending toward blue. This phenomenon is emphasized when the injection current is increased in order to increase the optical power of the diode: it is therefore very hard to control the light-emitting spectrum of such diodes, wherein the quantum wells are only exposed to a single electrical excitation source. Finally, it is very hard to create a stack of quantum wells emitting at different wavelengths without impairing the whole structure thus stacked, due to the increase in the temperature cycles needed to make such a stack. In particular, the last step of production of the diode, namely the formation of a layer p on the stack of quantum wells, can impair quantum wells with very high indium content (green wells) because this layer p is usually grown epitaxially at temperatures above 1000° C.

One aim of the present invention is to propose a new type of light-emitting diode, and a new associated production method making it possible to palliate at least one of the aforementioned drawbacks.

SUMMARY OF THE INVENTION

For this purpose, the invention proposes a method for the production of a light-emitting diode, the method comprising a step of preparing a light-emitting layer on a front face of a support, said emitting layer comprising at least two adjacent quantum wells emitting at different wavelengths, said quantum wells being in contact with the front face of the support.

In the context of the present invention, the term "adjacent quantum wells" is understood to mean at least two types of quantum wells emitting at different wavelengths, arranged set by side and not stacked, i.e. arranged on one and the same level on a growth axis A-A' of the light-emitting diode, said quantum wells being preferably in contact with each other.

Preferred but non-limiting aspects of the method described above are as follows:
  the step in which the light-emitting layer is deposited comprises a sub-step consisting in locally varying the temperature of a back face of the support such that the front face of the support comprises at least two areas at different temperatures; this makes it possible to vary the quantity of indium incorporated into the quantum wells formed on each of the different temperature areas,
  the step in which the light-emitting layer is deposited comprises a sub-step consisting in growing each quantum well on a respective area; advantageously, a same support can comprise several areas at a first temperature, and several areas at a second temperature, two facing areas at the first temperature being separated by one area at the second temperature,
  the sub-step consisting in locally varying the heating temperature of the support consists in heating the support under its back face, said support including at least one island on its back face; this makes it possible to obtain a support including regions of different temperatures,
  the method comprises a step of preparing the support consisting in creating at least one pattern on the back face of the support;
  the step of preparing the support consists in creating a plurality of patterns to obtain a support with a crenelated back face including steps;
  the step of preparing the support consists in creating a plurality of patterns to obtain a support with a crenelated back face including steps of different thicknesses and/or surface areas;
  the preparation step comprises the etching of the support on its back face to create at least one trench;
  the preparation step comprises the deposition of a material on the back face of the support so as to create at least one island on the back face of the support;
  the method further comprises the following steps:
    the deposition of an electron transport layer on a substrate,
    the deposition of an electron blocking layer—such as a layer of gallium nitride and aluminium AlGaN—on the light-emitting layer,
    the deposition of a hole transport layer on the light-emitting layer,
    the formation of metal contacts to allow the connection of the diode to an electrical power source.

Advantageously, the growth of each quantum well can be achieved by:
organometallic vapour-phase epitaxy from gas precursors of indium, aluminium, gallium and nitrogen, or by
molecular beam epitaxy from elementary sources comprising indium, aluminium, gallium and nitrogen.

The invention also concerns a light-emitting diode comprising a light-emitting layer on a front face of a support, said emitting layer comprising at least two adjacent quantum wells emitting at different wavelengths, said quantum wells being in contact with the front face of the support.

Preferred but non-limiting aspects of the diode described above are as follows:
the adjacent quantum wells have different dimensions (width, length);
the support comprises a substrate including patterns on its back face, the emitting layer extending over the front face of the substrate;
the support comprises a substrate of gallium nitride GaN, such as a polar, semi-polar or non-polar gallium nitride GaN substrate;
the diode comprises a metal layer forming a cathode over the whole surface of the back face of the diode.

BRIEF DESCRIPTION OF THE DRAWINGS

Other advantages and features of the method according to the invention and the associated product will become more apparent in the following description of several variants of execution, given by way of non-limiting examples, from the appended drawings wherein.

DETAILED DESCRIPTION OF THE INVENTION

There now follows a more detailed description of some examples of light-emitting diodes according to the invention and the methods of production of such diodes.

1. Light-emitting Diode 1.1. General Structure

Figure 1:
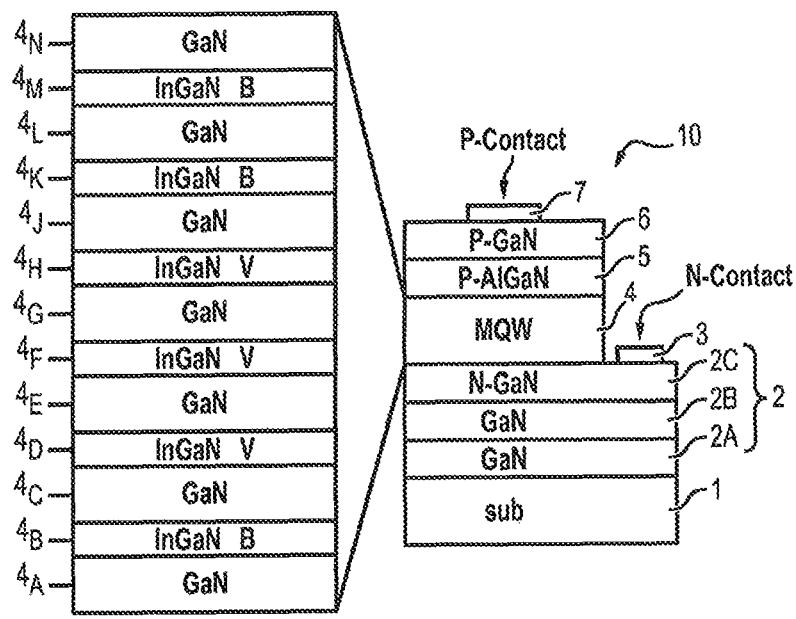
FIG. 1 illustrates an example of a monolithic diode of the prior art, composed of a vertical stack of quantum wells.
Figure 2:
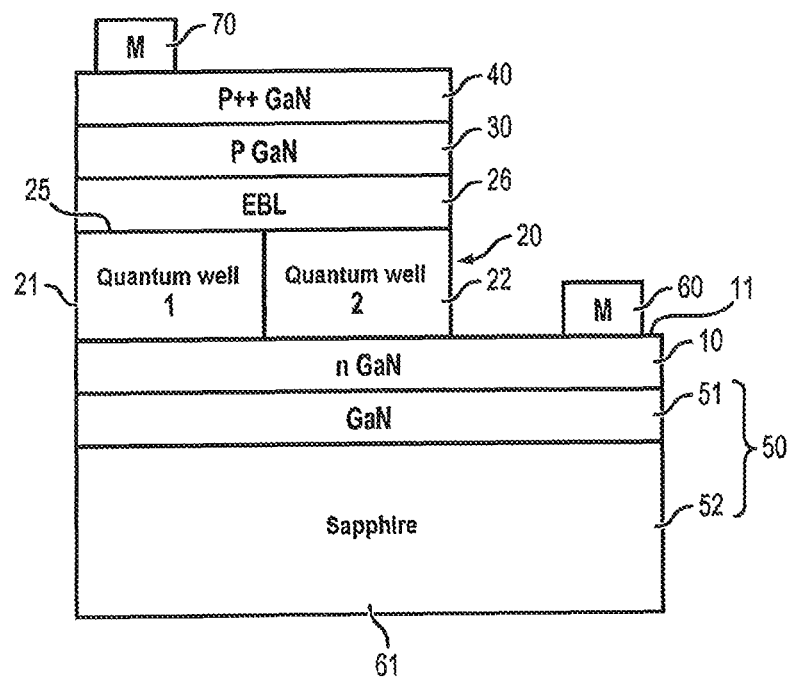
FIGS. 2 to 4 illustrate examples of light-emitting diodes, formed by quantum wells distributed laterally over the surface.
Figure 3:
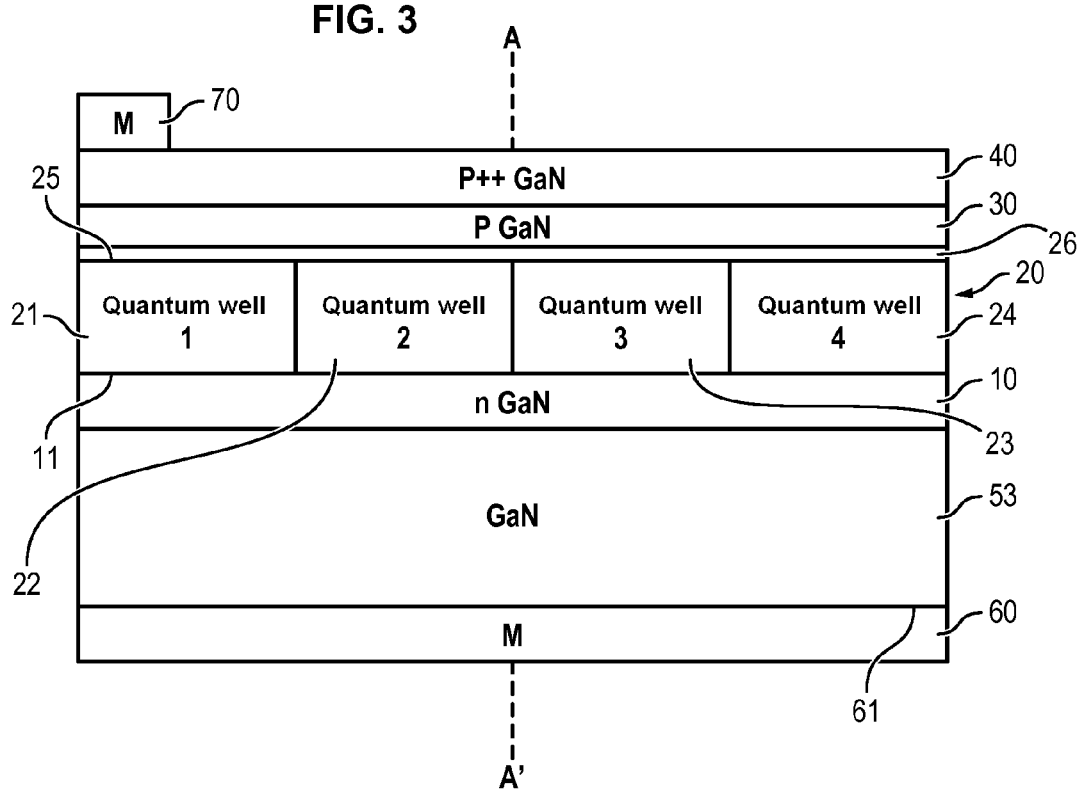
Figure 4:
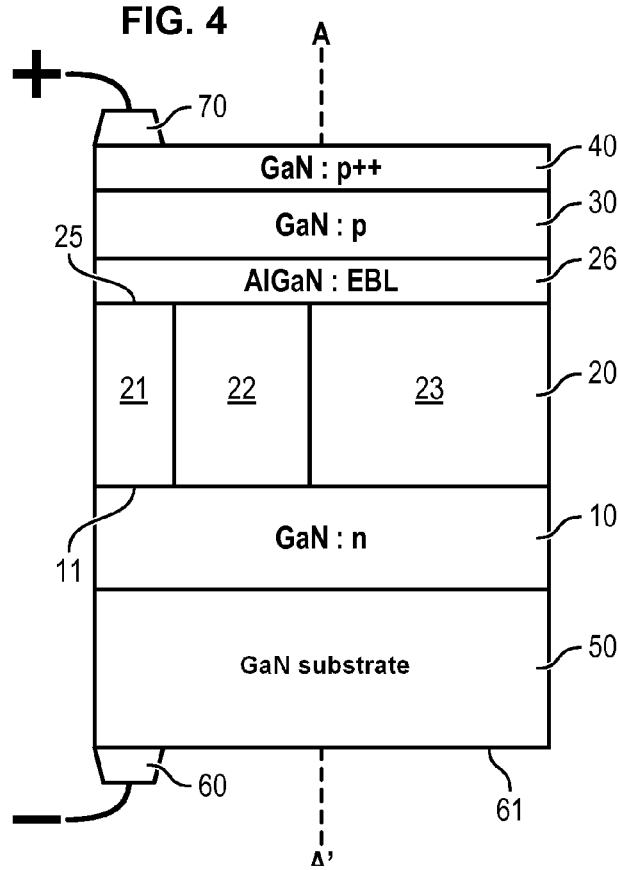

With reference to FIGS. 2 to 4, three variants of light-emitting diodes emitting white light are illustrated.

These light-emitting diodes comprise:
a n-doped electron transport layer 10, such as a layer of n-doped gallium nitride n-GaN,
a set of quantum wells 20 on the electron transport layer 10,
an electron blocking layer 26 (EBL) such as a layer of gallium nitride and aluminium AlGaN. This layer can be of p-doped or undoped type.
a p-doped hole transport layer 30, such as a layer of p-doped gallium nitride p-GaN over the set of quantum wells, and optionally
a layer of a p++-doped gallium nitride p++ GaN 40 (i.e. more heavily doped than the p-GaN layer) on the hole transport layer 30.

1.2. Initial Substrate

In the embodiments illustrated in FIGS. 2 and 3, the light-emitting diodes also comprise an initial substrate 50 supporting the transport layers 10, 30, the set of quantum wells 20, an electron blocking layer 26 of AlGaN and the p++GaN layer 40. This initial substrate 50 is used to prepare the light-emitting diodes, as will be described in more detail below.

In the embodiment illustrated in FIG. 2, the initial substrate 50 is composed of a gallium nitride film 51 on a sapphire wafer 52. In the case of FIG. 3, the initial substrate 50 is a layer of self-supporting gallium nitride 53.

The person skilled in the art will appreciate that, in the case of the diode illustrated in FIGS. 3 and 4, it is the electron transport layer 10 that serves as initial substrate when preparing a light-emitting diode.

1.3. First Metal Contact Forming a Cathode

In all cases, the diodes comprise a first metal contact 60 forming the cathode. This first metal contact 60 is intended to be connected to a negative terminal of an electrical power source (not represented) to supply the light-emitting diode with power, and more precisely to supply the electron transport layer 10 with electrons.

In the embodiment illustrated in FIG. 2, the first metal contact 60 is formed on the front face 11 of the electron transport layer 10, the sapphire wafer 52 being electrically insulating.

In the embodiments illustrated in FIGS. 3 and 4, the first metal contact 60 is positioned on the back face 61 of the light-emitting diode. More particularly:
the first metal contact 60 extends over the back face of the self-supporting gallium nitride GaN layer 53 in the embodiment illustrated in FIG. 3,
the first metal contact 60 extends over the back face of the electron transport layer 10 in the embodiment illustrated in FIG. 4.

Specifically, in the case in FIG. 3, the substrate is self-supporting GaN that has not been deliberately doped. It is therefore necessary to perform an epitaxial rework of Si-doped (n-type) GaN on such a substrate. In the case in FIG. 4, the self-supporting substrate is already n-doped. It therefore plays the electron-transporting role in addition to that of substrate. This last case is the most advantageous, for an optimized transport of electrons toward the p layer.

The use of an initial substrate based on gallium nitride (n-GaN electron transport layer or self-supporting GaN layer) makes it possible to position the first metal contact 60 on the back face 61 of the diode. The series resistance of the diode is thus reduced, compared to the structure in FIG. 2 and current losses due to heating are thus limited, which improves the light output of such light-emitting diodes.

Moreover, when the initial substrate is based on gallium nitride, the first metal contact 60 can advantageously be made over the whole surface of the back face 61 of the diode (as illustrated in FIG. 3) to further improve the light output of the latter—by reflection of the photon stream emitted by the light-emitting layer towards the front face of the diode.

1.4. Set of Quantum Wells

The set of quantum wells 20 extends over the front face 11 of the electron transport layer 10. This set of quantum wells 20 is composed of "n" quantum wells, "n" being a natural integer greater than or equal to 2:
- in the embodiment illustrated in FIG. 2, the set of quantum wells is composed of two quantum wells 21, 22;
- in the embodiment illustrated in FIG. 4, the set of quantum wells is composed of three quantum wells 21, 22, 23;
- in the embodiment illustrated in FIG. 3, the set of quantum wells is composed of four quantum wells 21, 22, 23, 24.

In all cases, the quantum wells 21, 22, 23, 24 of a set 20 are adjacent, i.e. they are arranged side by side on the front face 11 of the electron transport layer 10.

Each quantum well 21, 22, 23, 24 is composed of at least one layer of indium aluminium gallium nitride $In_xAl_yGa_{1-x-y}N$, in which the concentrations of indium and/or aluminium and/or gallium vary from one quantum well to another.

Each quantum well 21, 22, 23, 24 is adapted to emit light at one (or more) given wavelength(s), such that each of the quantum wells emits light of a different colour. The set of adjacent quantum wells (or sequence of wells) must preferably be contained within the perimeter of the diode. In other words, the lateral dimensions of this sequence of wells must be smaller than the common dimensions of the diodes which are between 100 µm and 1 mm.

In the variant embodiment illustrated in FIG. 4, a first quantum well 21 is adapted to emit blue light, a second quantum well 22 is adapted to emit green light, and a third quantum well 23 is adapted to emit red light.

In the variant embodiment illustrated in FIG. 2, a first quantum well 21 is adapted to emit blue light, and a second quantum well 22 is adapted to emit green light. In the variant embodiment illustrated in FIG. 4, the four quantum wells 21, 22, 23, 24 emit light in blue, green, red and yellow light respectively.

In all cases, the mixture of the lights of different colours (red, green, blue, yellow etc.) emitted by a set of quantum wells 20 makes it possible to emit a composite light of predetermined colour, and in particular white light.

The lateral dimensions of each quantum well 21, 22, 23, 24 depend on the desired composite colour. This is because the composite colour is a function of the intensity of the light emitted by each quantum well.

For example, for the colours red, green and blue, it is known that:
- the light output of a quantum well emitting in the blue region is greater than the light output of a quantum well emitting in the green region,
- the light output of a quantum well emitting in the green region is greater than the light output of a red quantum well.

Therefore, to emit a white composite light from the quantum wells 21, 22, 23 emitting lights of these three colours:
- the dimensions of the quantum well emitting in the blue region 21 will be less than the dimensions of the quantum well emitting in the green region 22, and
- the dimensions of the quantum well emitting in the green region 22 will be less than the dimensions of the quantum well emitting in the red region 23.

The dimensions of the quantum wells 21, 22, 23, 24 of a set of quantum wells 20 will therefore be determined according to the targeted application.

The same applies for the shape of the various quantum wells.

In the embodiments illustrated in FIGS. 2 to 4, each quantum well of the set of quantum wells is of parallelepipedal shape.

Figure 5:
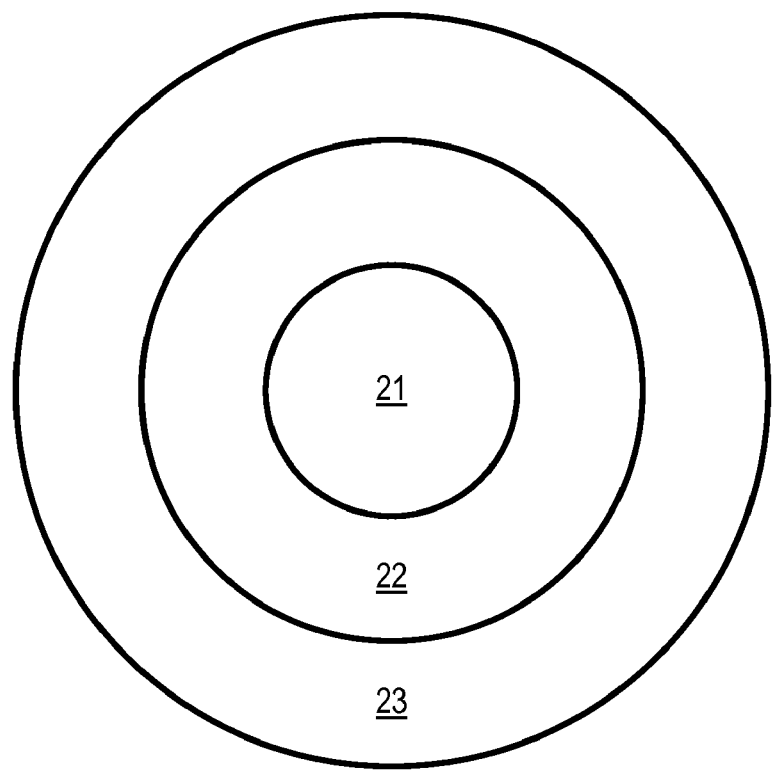
FIG. 5 illustrates a top view of an example of a light-emitting layer comprising concentric quantum wells.

In a variant, the quantum wells can be of cylindrical shape as illustrated in FIG. 5.

In this embodiment, the set of quantum wells comprises:
- a first quantum well 21 of cylindrical shape and adapted to emit blue light,
- a second quantum well 22 in the shape of a cylindrical tube running along the periphery of the first quantum well 21, this second quantum well 22 being adapted to emit green light, and
- a third quantum well 23 in the shape of a cylindrical tube running along the periphery of the second quantum well 22, this third quantum well 23 being adapted to emit red light.

1.5. Hole Transport Layer, GAN p++ Layer and Second Metal Contact

As described above, the diode also comprises:
- an electron blocking layer 26, such as a layer of gallium and aluminium AlGaN and
- a hole transport layer 30, such as a layer of p-doped gallium nitride.

This hole transport layer 30 extends over the whole surface of the electron blocking layer 26 deposited on the front face 25 of the set of quantum wells 20. The electron 10 and hole 30 transport layers form the electrical injection layers of the diode.

This is why the hole transport layer 30 is intended to be connected to the positive terminal of the electrical power source (not represented), by way of a second metal contact 70 forming the anode.

This second metal contact 70 can be:
- directly in contact with the hole transport layer 30, or
- in contact with an intermediate p++GaN layer 40 extending over the whole surface of the front face of the hole transport layer, as illustrated in FIGS. 2 to 4.

This heavily p-doped p++GaN intermediate layer 40c has electrical conductivity characteristics close to those of a metal.

The use of such a p++GaN layer allows better distribution of the charges coming from the electrical power source over the whole surface of the hole transport layer 30.

The metal contact p is generally made up of a thick metal pad (a few hundred nm) 70, and a thin (ten or so nm) metal layer covering the whole surface p of the diode. It has the function of evenly distributing the current lines so that the radiative recombination of the electron-hole pairs in the wells and thus the photon stream is distributed evenly over the whole surface of the diode.

A description will now follow of various examples of methods for obtaining light-emitting diodes. These examples of methods will be described with reference to the production of a diode comprising quantum wells emitting blue, green and red lights.

2. Method of Production

2.1. General Principle

The wavelength(s) of the light emitted by a quantum well made of gallium nitride and indium InGaN depend(s) on the local temperature at which said quantum well was made.

This is because the colour of the light emitted by a quantum well depends on its indium concentration.

However, the inclusion of indium in a quantum well is itself dependent on the local temperature at which the quantum well was prepared: the lower the preparation temperature of the quantum well, the higher the concentration of indium in the layer forming the quantum well.

Thus, the preparation temperature of a quantum well emitting in the blue region is higher than the preparation temperature of a quantum well emitting in the green region. Similarly, the preparation temperature of a quantum well emitting in the green region is higher than the preparation temperature of a quantum well emitting in the red region.

To produce a diode comprising a plurality of adjacent quantum wells emitting lights of different colours, in the methods described below it is proposed to locally vary the surface temperature of the front face of the support on which the plurality of quantum wells have been made.

This makes it possible to obtain a light-emitting layer comprising a plurality of adjacent quantum wells emitting at different wavelengths, said quantum wells being in contact with the front face of the support.

2.2. Embodiments of Production Methods

Figure 6:
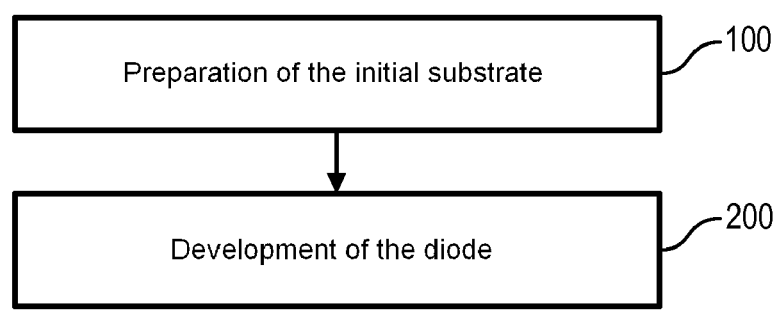
FIG. 6 schematically illustrates an example of a method for the production of a light-emitting diode.

FIG. 6 illustrates an example of a method of production of a light-emitting diode comprising a light-emitting layer 20 composed of adjacent quantum wells 21, 22, 23, 24 emitting at different wavelengths.

A first phase 100 of the method consists in preparing the initial substrate 50 on which the light-emitting diode is produced.

A second phase 200 of the method consists in preparing the light-emitting diode proper.

This second phase is carried out in a vapour-phase growth reactor.

Such a reactor operates on the following general principle. The initial substrate 50 is arranged on the upper face of a susceptor 80. This susceptor 80 comprises heating elements (not represented) allowing the heating of the upper face of the susceptor 80, and therefore of the initial substrate 50. Precursors are guided to the initial substrate by a carrier gas. Upon contact with the heated initial substrate, the gas is then broken down by pyrolysis, feeding the growth of the deposit.

Thus, in conventional vapour-phase growth reactors, the heating of the initial substrate is obtained by heating the susceptor 80 on which it lies.

In certain embodiments, the production method uses this general principle to locally vary the temperature of the substrate on which the light-emitting diode is prepared.

In particular, the first phase of the production method consists in forming steps (or patterns) on the back face of the substrate to incur a variation of the temperature of the front face of the substrate facing said steps.

2.2.1. Preparation of the Substrate

As stated previously, the initial substrate 50 can be of various types.

For example, the initial substrate 50 can comprise:
a GaN gallium nitride film 51 on a sapphire wafer 52, or else
a self-supporting gallium nitride layer 53.

The gallium nitride layer (or film respectively) can be polar, semipolar or non-polar.

The use of polar gallium nitride makes it harder to prepare a quantum well emitting red light and with a high light output. Specifically, the presence of a polarity in the gallium nitride GaN used to prepare a quantum well induces an electric field in the well that reduces the electron-hole transition energy and thus sifts the emission wavelength to the higher values of wavelength, which is beneficial for obtaining the colour red for example. But at the same time, the presence of this electric field considerably reduces the light output due to the fact that the electron in the conduction band and the hole in the valence band are spatially remote from one another on either side of the quantum well (Stark effect). This shift of the emission wavelength to the red and the reduction of the light output of the quantum well are greater when the quantum well is thicker. To achieve a quantum well emitting in the red region, and increase the overlap of the wavefunctions of the electron and the hole (improve the light output) using a substrate of polar gallium nitride, it is thus necessary to make a quantum well of small thickness (better overlapping of wavefunctions), while increasing the indium content in the InGaN alloy. However, the structural quality of wells with high indium content is impaired, which also leads to low light output.

The use of non-polar gallium nitride (no polarity) or semipolar (with a polarity 10 times below that of the polar gallium nitride) makes it possible to avoid the Stark effect. In the absence of an electric field, the overlap of the electron and hole wavefunctions in the well is improved, which favours a high light output. Moreover, it has been established that the indium incorporation level is higher in semi- and non-polar nitrites. These orientations are therefore favourable to obtaining quantum wells with long emission wavelengths and a high light output.

Figure 7:
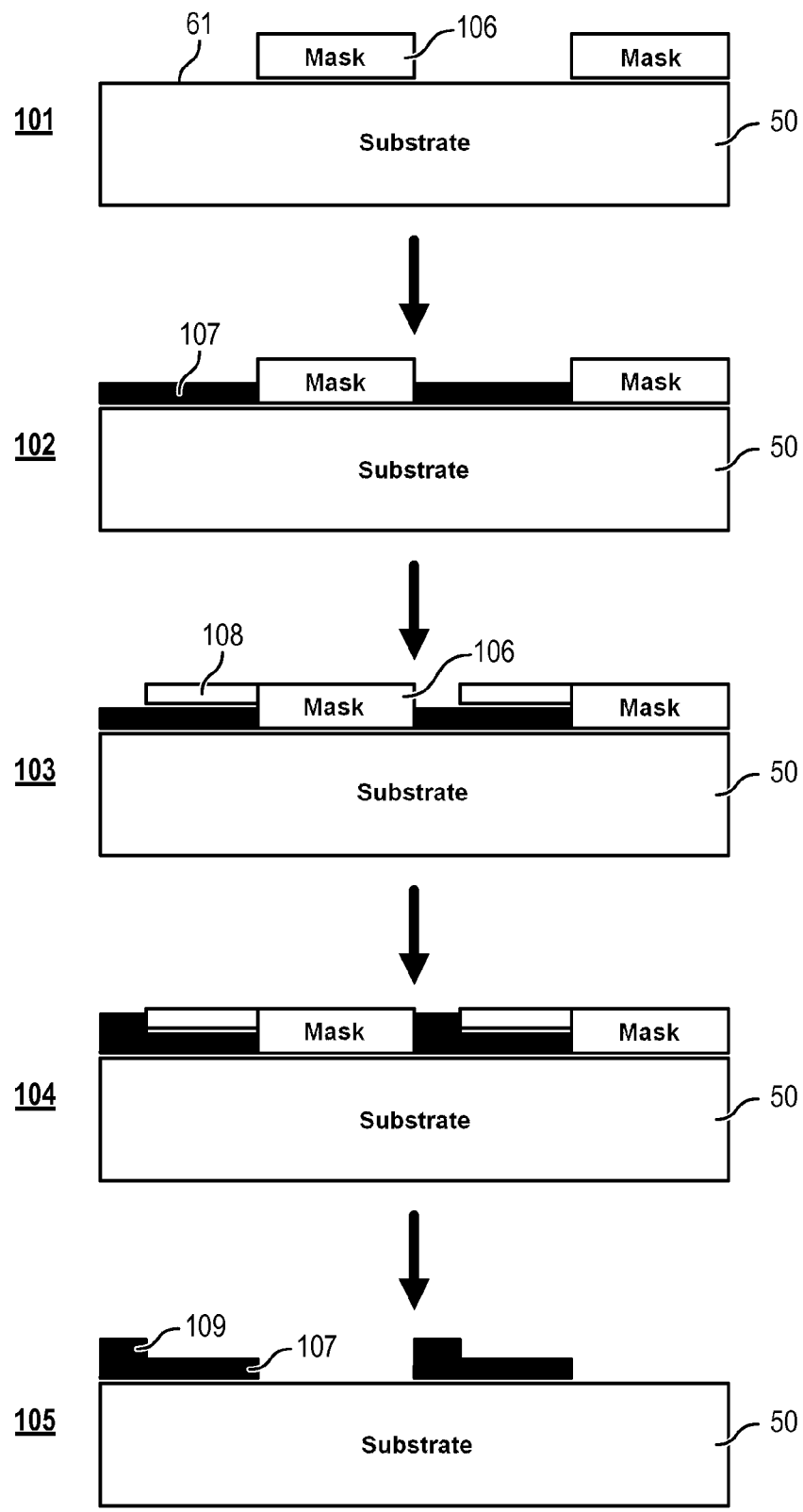
FIGS. 7 and 10 illustrate variants of the phase of preparing the back face of a substrate.

With reference to FIG. 7, a first variant preparation of the substrate is illustrated, making it possible to make steps on the back face of the latter.

In this example, the substrate is intended to be used for the production of diodes each comprising quantum wells emitting blue, green and red lights.

A first mask 106 is deposited (step 101) on the back face 61 of the initial substrate 50. Quantum wells emitting red light will be prepared above the regions covered by the first mask.

The deposition of the first mask 106 can be achieved by depositing resin over the whole surface of the back face of the substrate, and leaving uncovered strips corresponding to the openings of the latter.

A first metallic deposition (step 102) is implemented in the apertures of the first mask. This induces the formation of metallic strips 107 of a first thickness extending over the back face of the initial substrate 50. The first thickness of the metallic strips 107 depends on the emission colour desired for each quantum well.

A second mask 108 (step 103) is deposited so as to cover a portion of the openings of the first mask 106. Quantum wells emitting blue light will be prepared above the regions not covered by the first and second masks 106, 108.

The deposition of the second mask 108 can be achieved by carrying out a new deposition of resin over the whole surface of the back face of the initial substrate 50, and uncovering the strips corresponding to the apertures of the second mask.

A second metallic deposition (step 104) is implemented in the apertures of the second mask. Metallic strips 109 are obtained of a second thickness extending into the apertures of the second mask 108. Here again, the second thickness of deposited metal is a function of the emission wavelengths desired for the quantum well.

The first and second masks 106, 108 are removed (step 105).

An initial substrate is obtained in which the crenelated back face includes steps formed:
by areas supporting metallic trips 109 of the second thickness,
by areas supporting metallic strips 107 of the first thickness less than the second thickness, and
by areas without metallic strips.

This initial substrate 50 is then placed in a reactor to implement the second phase of preparation of the diode.

Figure 8:
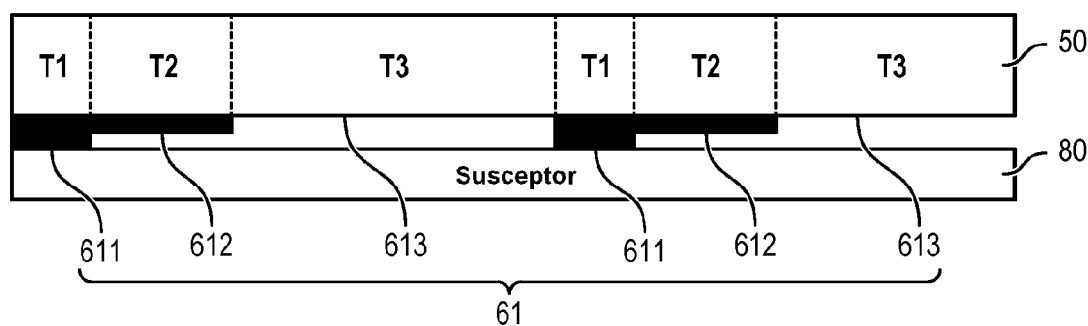
FIGS. 8 and 9 illustrate examples of prepared initial substrates.

As illustrated in FIG. 8, the crenelated back face is in contact with the heating susceptor 80.

The areas 611 of the back face where the strips of the second thickness extend are in contact with the susceptor, while the other areas 612, 613 (i.e. areas 613 without strips and areas 612 where the strips of first thickness extend) are more or less remote from the susceptor.

Thus, the local temperature of the initial substrate varies according to its associated area:
   the portions of the substrate situated above the ones 611 are at a first temperature T1, quantum wells emitting blue light will for example be prepared above these areas 611,
   the portions of the substrate located above the areas 612 are at a second temperature T2, quantum wells emitting a green light will for example be prepared above these areas 612,
   the portions of the substrate located above the areas 613 are at a third temperature T3, quantum wells emitting a red light will for example be prepared above these areas 613.

The person skilled in the art will appreciate that the material deposited on the back face of the substrate to form the strips of different thickness is not limited to metals. Other heat-conducting materials such as silica can be used.

In a variant, a heat-insulating material can be deposited on the back face of the initial substrate. In this case, the heat-insulating material is arranged on the areas above which one wishes to prepare quantum wells of high indium concentration (i.e. quantum well emitting a red and green light, the areas below which one wishes to prepare quantum wells emitting at short wavelengths being without heat-insulating material.

Figure 10:
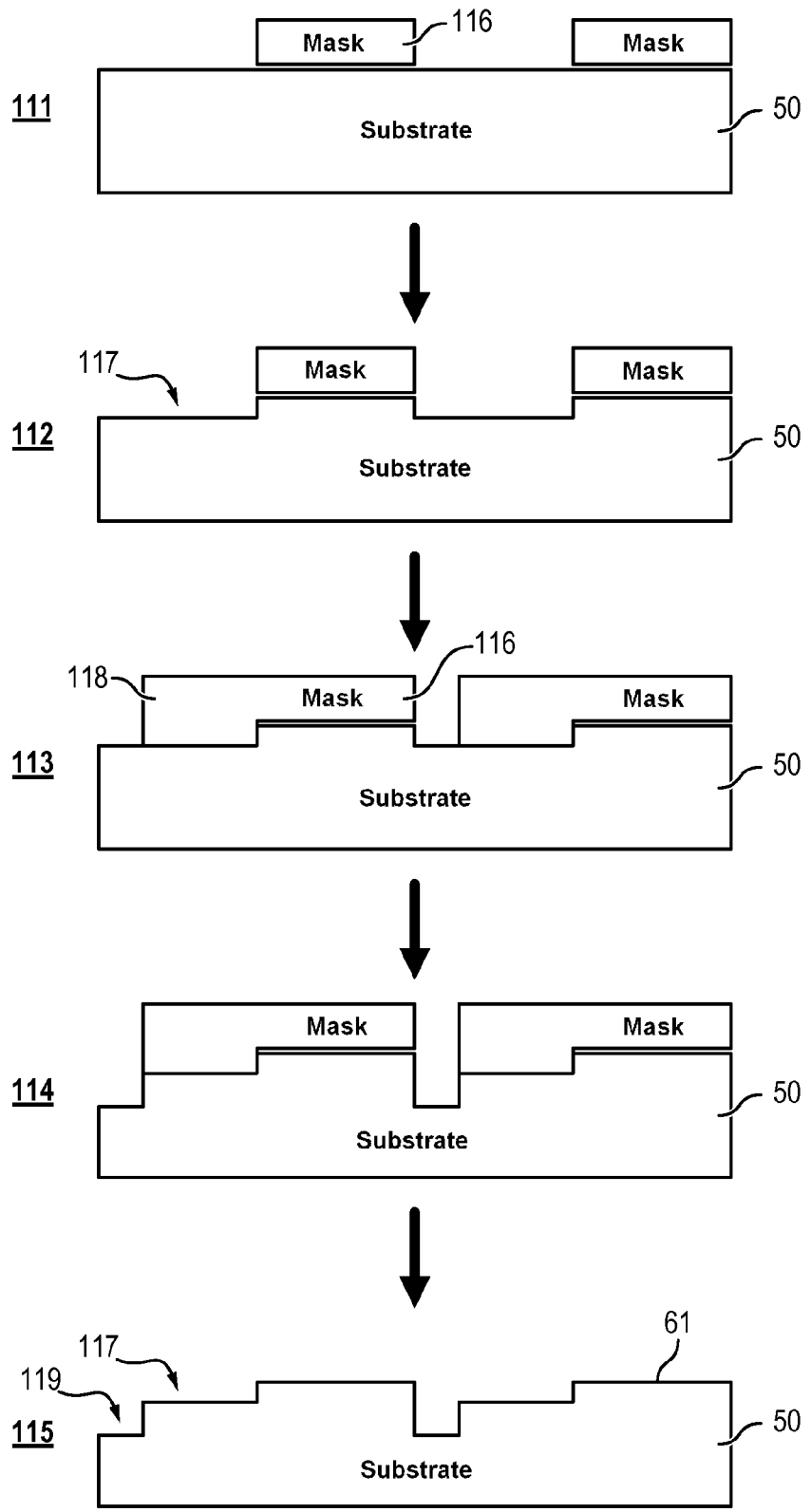
Figure 11:
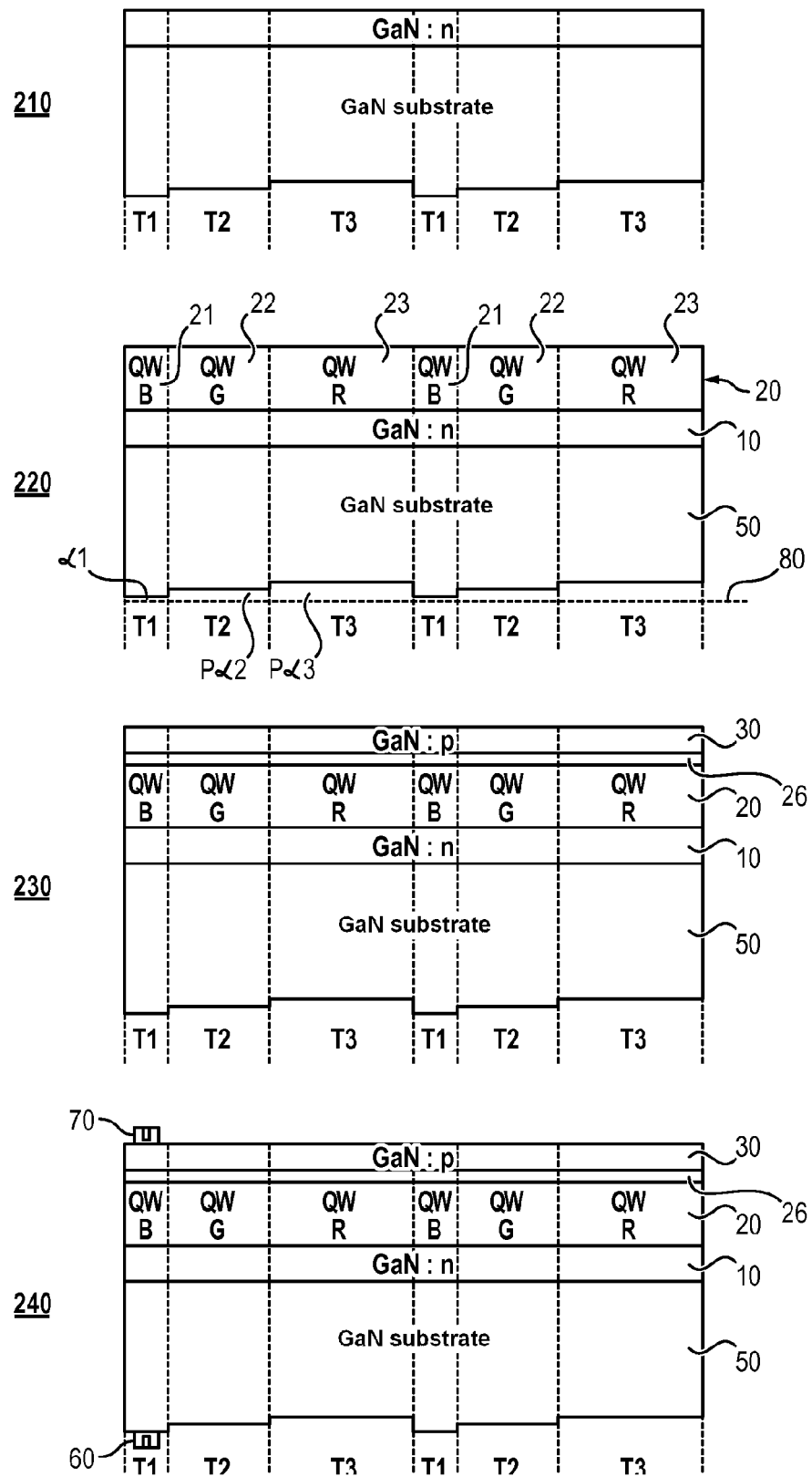
FIG. 11 illustrates an example of a preparation phase of elements composing a light-emitting diode.

With reference to FIG. 10, another variant of preparation of the initial substrate 50 is illustrated. In this variant, rather than depositing a material on the back face of the initial substrate 50 to form the steps, the initial substrate 50 is etched.

A first mask 116 is deposited (step 111) on the back face of the initial substrate 50. Quantum wells emitting blue light will be prepared above the areas covered by the first mask.

The deposition of the first mask 116 can be obtained by depositing a layer of resin and uncovering strips forming the apertures of the first mask.

Etching (step 112) of the initial substrate is implemented through the apertures of the first mask 116. This incurs the formation of trenches 117 of a first depth in the back face of the initial substrate 50.

A second mask 118 partly covering the apertures of the first mask 116 is deposited (step 113). Quantum wells emitting red light will be prepared above the apertures of the first and second masks.

The deposition of the second mask 118 can be achieved by carrying out a new deposition of resin over the whole surface of the back face of the initial substrate 50, and uncovering strips corresponding to the apertures of the second mask 118.

A second etching (step 114) is made in the apertures of the second mask 118. Trenches 119 of a second depth are obtained in the initial substrate 50.

The first and second masks 116, 118 are removed (step 115).

Figure 9:
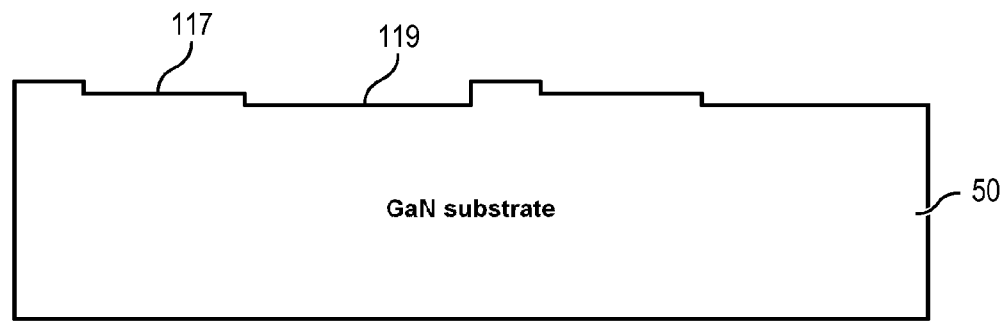

An initial substrate 50 as illustrated in FIG. 9 is obtained, with a crenelated back face including steps formed:
   by areas including trenches 119 of the second depth,
   by areas supporting trenches 117 of the first depth less than the second depth, and
   by areas without trenches.

As for the variant embodiment illustrated in FIG. 7, the first and second depths of the trenches are a function of the wavelengths desired for the quantum wells.

2.2.2. Preparation of Diodes

The prepared initial substrate 50 is arranged on a susceptor of a vapour-phase growth reactor.

An n-doped electron transport layer—such as a layer of n-doped gallium nitride N—GaN—is deposited on the initial substrate 50 (step 210).

The deposition of the electron transport layer is for example achieved either by organometallic vapour-phase epitaxy (OMVPE), or by molecular beam epitaxy (MBE).

The set of quantum wells 20 is then prepared (step 220).

Due to the steps present on the back face of the initial substrate 50, the local temperatures, facing these steps, vary at the surface of the transport layer 10:
   the steps in contact with the susceptor (zero distance d1 between the susceptor and the substrate) efficiently guide the heat produced by the heating elements of the susceptor through the substrate and the electron transport layer in such a way that the volumes of material located above the areas of the substrate in contact with the susceptor 80 are at a temperature T1;
   the steps spaced by distance d2 from the susceptor 80 guide the heat produced by the heating elements less efficiently (due to the distance d2 between the susceptor 80 and the substrate 50) so that the volumes of material extending above the areas spaced by a distance d2 are at a temperature T2 below T1;
   the steps spaced a distance d3 (greater than d2) from the susceptor 80 guide the heat produced by the heating elements of the susceptor 80 even less efficiently so that the volumes of material extending above the areas spaced by a distance d3 are at a temperature T3 below T2.

The preparation of the quantum wells is implemented by organometallic vapour-phase epitaxy from gas precursors of indium, aluminium, gallium and nitrogen, or by molecular beam epitaxy from elementary sources comprising indium, aluminium, gallium and nitrogen.

The quantum wells 21, 22, 23 form on the surface of the electron transport layer 10. According to the temperatures T1, T2, T3, the quantum wells 21, 22, 23 contain a more or less high indium concentration.

Specifically, the incorporation of indium in a layer is a function of the preparation temperature of this layer: the lower this preparation temperature, the larger the quantity of indium incorporated; conversely, the higher the temperature the smaller the quantity of indium incorporated.

Due to their different concentrations of indium, the quantum wells 21, 22, 23 emit light of different colours.

A plurality of adjacent quantum wells is obtained of different indium concentrations, emitting luminous radiation at different wavelengths.

A p-doped electron blocking layer (EBL) 26 is deposited on the set of quantum wells 20 (step 230). This electron blocking layer is for example a p-doped gas and aluminium p-AlGaN layer. The electron blocking layer 26 is deposited either by organometallic vapour-phase epitaxy (OMVPE) or by molecular beam epitaxy (MBE).

A p-doped hole transport layer 30 is deposited on the electron blocking layer (step 230). This hole transport layer 30 is for example a p-doped gallium nitride p-GaN layer.

The hole transport layer 30 is deposited either by organometallic vapour-phase epitaxy (OMVPE) or by molecular beam epitaxy (MBE).

Another step of the method consists in making the metal contacts (step 240) of the diode to allow it to be connected to an electrical power source. A contact 60 is made (for example on the back face of the substrate.) Another contact 70 is made on the front face of the hole transport layer 30.

3. Examples and Results

A series of quantum well growths has been carried out to demonstrate the validity of the concept of temperature variation on the surface of a substrate due to the presence of vacuum on the back face of the substrate.

As indicated above, the composition of the alloy $In_xGa_{1-x}N$ is very sensitive to the growth temperature: in identical flow conditions, the indium content is higher when the epitaxy temperature is lower.

The substrate temperature is mainly obtained by contact with the hot susceptor, so if there is no contact (between the susceptor and the substrate) cold spots are obtained locally.

In this study, substrates each composed of a gallium nitride GaN film (polar or semipolar) on a sapphire wafer were used.

Substrates acting as controls were not prepared. Others were prepared in such a way as to obtain a silica strip pattern:

Of 1 μm thick on their back face,
Of 2 μm thick on their back face.

Quantum well structures were developed on these substrates.

Characterizations by photoluminescence (cf. FIGS. 12 and 13) and by cathodoluminescence (cf. FIG. 14) were employed.

Figure 12:
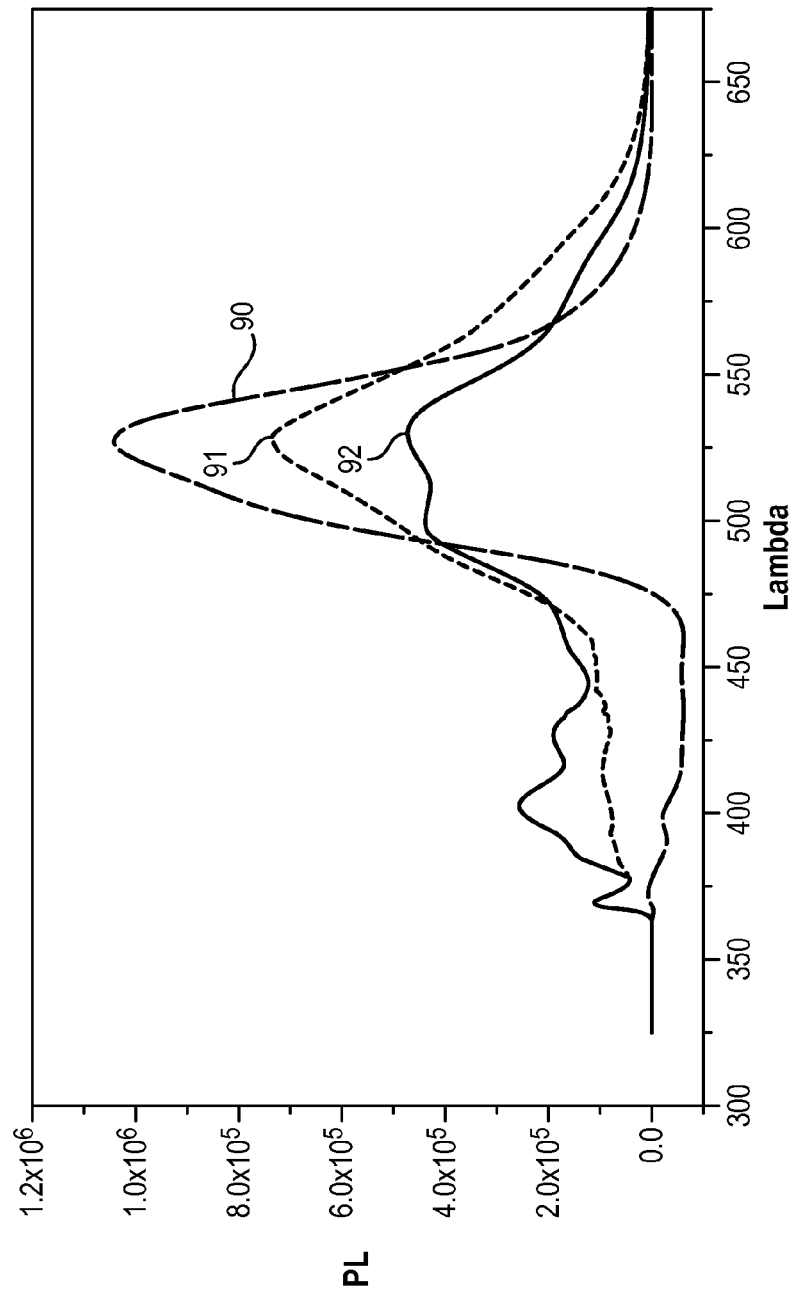
FIGS. 12 and 13 illustrate spectra obtained by photoluminescence.

FIG. 12 illustrates the photoluminescence spectrum obtained for substrates comprising a semipolar gallium nitride layer, and more precisely for:

a control substrate (i.e. unprepared not containing patterns on its back face),
a prepared substrate comprising $SiO_2$ strips of a thickness of 1 μm on its back face,
a prepared substrate comprising $SiO_2$ strips of a thickness of 2 μm on its back face.

A light-emitting layer comprising two adjacent quantum wells emitting light of different colours was formed on each of the prepared substrates.

It was noted that the spectrum 91 of the substrate including 1 μm strips is wider than the spectrum 90 of the control substrate.

The spectrum 92 of the substrate including strips of 2 μm is very wide and exhibits two areas of maxima in the blue-violet region and in the green-yellow region.

Figure 13:
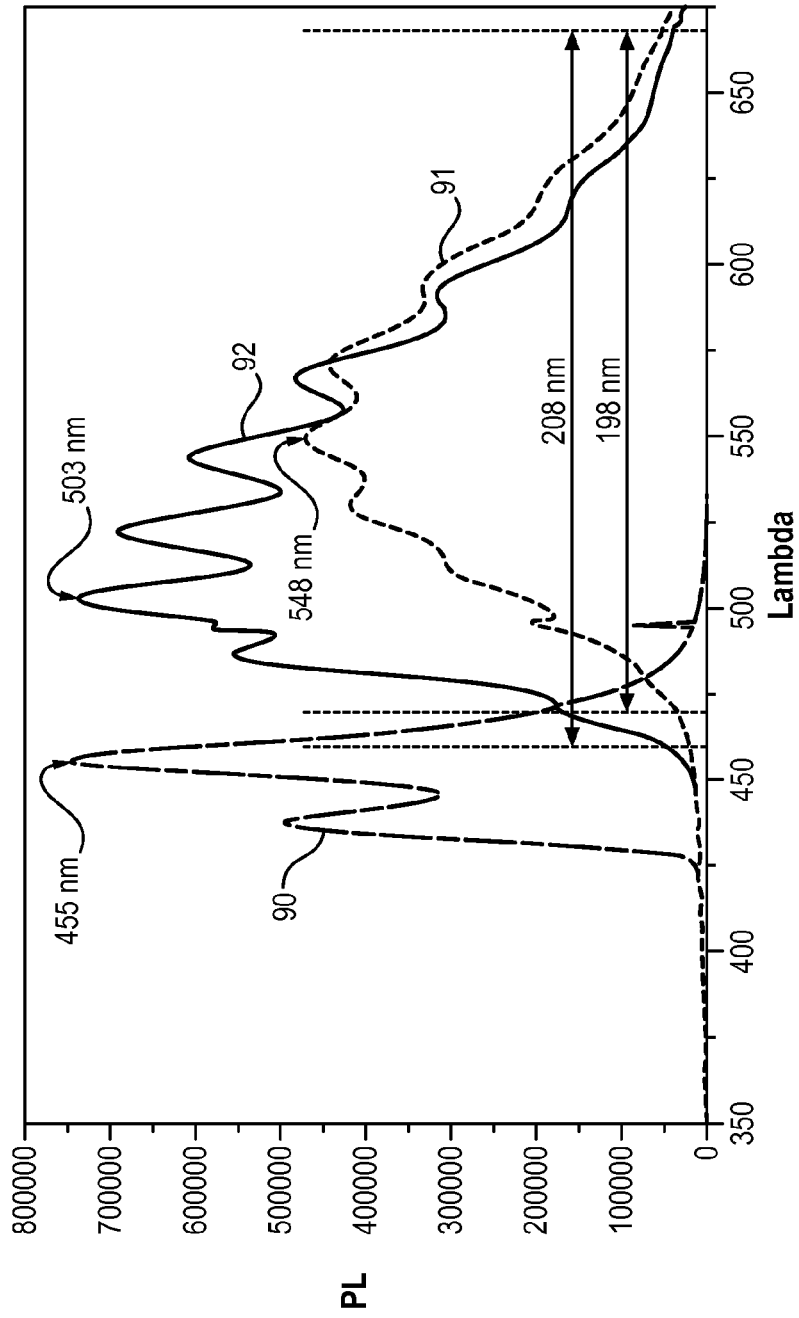

FIG. 13 illustrates the photoluminescence spectrum obtained for substrates comprising a layer of polar gallium nitride, and more precisely for:

a control substrate (i.e. unprepared not containing patterns on its back face),
a prepared substrate comprising $SiO_2$ strips of a thickness of 1 μm on its back face,
a prepared substrate comprising $SiO_2$ strips of a thickness of 2 μm on its back face.

The spectra 91, 92 of the two substrates including strips are wider than the spectrum 90 of the control substrate. The spectrum 92 of the substrate including strips of 2 μm is more intense.

The spectra 91, 92 of the two substrates including strips are centered at higher wavelengths than the spectrum 90 of the control substrate, a sign of a lower mean temperature during growth.

For the characterization by cathodoluminescence, a series of spectra was taken on epitaxial polar wells on sapphire substrates possessing silica strips of 2 μm in thickness on the back face of the substrate (the structure corresponding to the photoluminescence spectrum 92 in FIG. 13) varying the position of the spotlight by a few tens of μm (the range of measurements represented extends over 4 mm).

Figure 14:
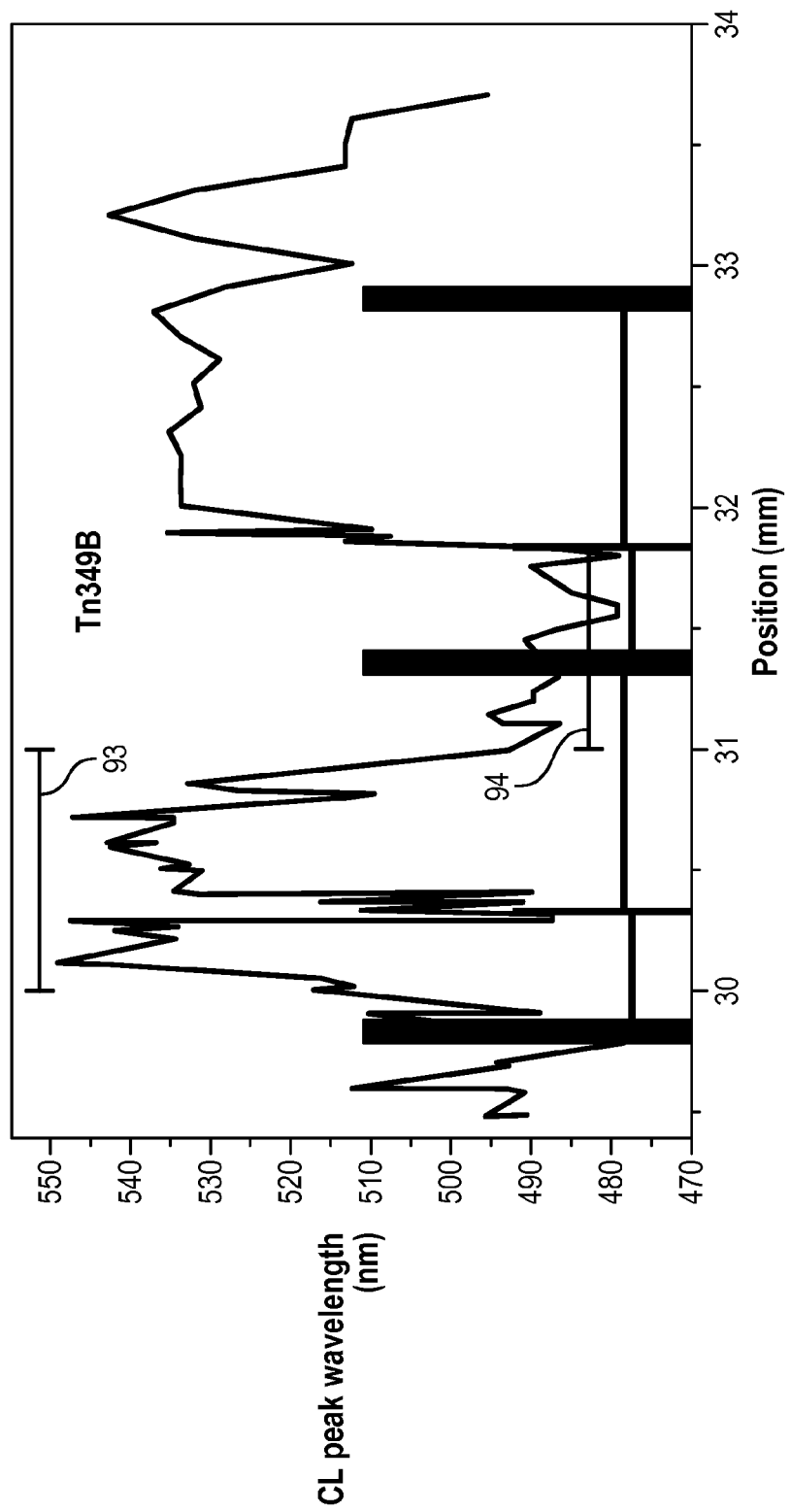
FIG. 14 illustrates spectra obtained by cathodoluminescence.

As illustrated in FIG. 14, the two ranges 93, 94 of wavelengths of the quantum wells (already identified by photoluminescence) are clearly observed.

A periodic alternation is thus highlighted, corresponding to the local temperature differences of the wafer due to the $SiO_2$ strips arranged on the back face of the substrate. These local wavelength variations are sharp, a necessary condition for obtaining a plurality of wavelengths on the scale of the dimensions of a diode, and thus obtaining a white diode.

The method described above allows the production of diodes emitting at predetermined lights.

The person skilled in the art will understand that many modifications can be made to the method described above without materially departing from the new teachings presented here.

It is therefore clearly obvious that the examples that have just been given are only particular illustrations and in no way limiting.

The invention claimed is:

1. A method of production of a light-emitting diode comprising a step of preparing a light-emitting layer on a front face of a support, said emitting layer comprising at least two adjacent quantum wells emitting at different wavelengths, said quantum wells being in contact with the front face of the support, wherein the step in which the light-emitting layer is deposited consists in locally varying the temperature of a back face of the support opposite the front face in such a way that the front face of the support comprises at least two areas at different temperatures.

2. The method according to claim 1, wherein the local temperature variation of the support is achieved on areas of different dimensions.

3. The method according to claim 1, wherein the step of depositing the emitting layer comprises a sub-step consisting in growing each quantum well on a respective area.

4. The method according to claim 3, wherein the growth of each quantum well is achieved by:
organometallic vapour-phase epitaxy from gaseous precursors of indium, aluminium, gallium and nitrogen, or by
molecular beam epitaxy from elementary sources comprising indium, aluminium, gallium and nitrogen.

5. The method according to claim 1, wherein the step in which the light-emitting layer is deposited consisting in locally varying the temperature of the support consists in heating the support under its back face, said support including at least one island on its back face.

6. The method according to claim 1, comprising:
the deposition of an electron transport layer on a substrate,
the deposition of an electron blocking layer on the light-emitting layer,
the deposition of a hole transport layer on the electron blocking layer,
the formation of metal contacts to allow the connection of the diode to an electrical power source.

7. A method of production of a light-emitting diode comprising a step of preparing a light-emitting layer on a front face of a support, said emitting layer comprising at least two adjacent quantum wells emitting at different wavelengths, said quantum wells being in contact with the front face of the support, which comprises a step of preparation of the support consisting in making a plurality of patterns on the back face of the support to obtain a support having a crenelated back face including steps of different thicknesses and/or surfaces.

8. The method according to claim 7, wherein the step of preparation comprises the etching of the support on its back face to create at least one trench.

9. The method according to claim 7, wherein the step of preparation comprises the deposition of a material on the back face of the support so as to create at least one island on the back face of the support.

10. The method according to claim 7, wherein the crenelated back face of the support is then arranged on a heating susceptor of a vapor-phase growth reactor.

11. A light-emitting diode comprising a light-emitting layer on a front face of a support, said emitting layer comprising at least two adjacent quantum wells emitting at different wavelengths, said quantum wells being in contact with the front face of the support, wherein the support comprises a substrate including patterns on its back face and having a crenelated back face including steps of different thicknesses and/or surfaces, the emitting layer extending over the front face of the substrate.

12. The light-emitting diode according to claim 11, wherein the support comprises a gallium nitride GaN substrate.

13. The light-emitting diode according to claim 11, wherein the support comprises a semipolar or nonpolar gallium nitride GaN substrate.

14. The light-emitting diode according to claim 11, which comprises a metal layer forming a cathode over the whole surface of the back face of the diode.

* * * * *